United States Patent [19]
Carleton

[11] Patent Number: 6,141,669
[45] Date of Patent: Oct. 31, 2000

[54] PSEUDORANDOM BINARY SEQUENCE BLOCK SHIFTER

[75] Inventor: Gregory Carleton, Varier, Canada

[73] Assignee: Nortel Networks Corporation, Montreal, Canada

[21] Appl. No.: 09/073,453

[22] Filed: May 6, 1998

[51] Int. Cl.$^7$ ........................................................ G06F 1/02
[52] U.S. Cl. .............................. 708/252; 380/46; 375/208
[58] Field of Search ..................... 708/250–256, 708/492; 380/46, 50; 375/208

[56] References Cited

U.S. PATENT DOCUMENTS

| | | | |
|---|---|---|---|
| 4,685,132 | 8/1987 | Bishop et al. ............................ | 708/250 |
| 4,965,881 | 10/1990 | Dilley ....................................... | 708/252 |
| 5,596,516 | 1/1997 | Higashi et al. .......................... | 708/252 |
| 5,910,907 | 6/1999 | Chen et al. ............................... | 380/46 |
| 5,987,056 | 11/1999 | Banister ................................... | 375/200 |

OTHER PUBLICATIONS

Internet web page http://www.csr.uvic.ca/home/mserra/CA-paper/node4.html, "Linear Feedback Shift Retgisters", M. Serra, Jun. 24, 1996.

Internet web page http://www.cdj.org/a_ross/LFSR.html, "Linear Feedback Shift Registers", Arthur H.M. Ross, Ph.D., date unknown.

*Primary Examiner*—Tan V. Mai
*Attorney, Agent, or Firm*—Cobrin & Gittes

[57] ABSTRACT

A method and apparatus for determining the state, at any time in the past, relative to a present state, of a linear feedback shift register comprises determining a an inverse transition matrix which, if multiplied by the current state in modulo-2 arithmetic, yields the state one step into the past; and multiplying in modulo-2 arithmetic the present state of the linear feedback shift register by the inverse transition matrix N times to obtain the state N steps into the past.

28 Claims, 8 Drawing Sheets

$$G^{-1} = \begin{bmatrix} 0 & 1_{1,2} & \cdot & \cdot & \cdot & \cdot & \cdot & \cdot & \cdot & 0 \\ 0 & 0 & 1_{2,3} & \cdot & \cdot & \cdot & \cdot & \cdot & \cdot & 0 \\ 0 & 0 & 0 & 1_{3,4} & \cdot & \cdot & \cdot & \cdot & \cdot & \cdot \\ \cdot & \cdot & \cdot & \cdot & \cdot & \cdot & \cdot & \cdot & \cdot & \cdot \\ 1_{k,1} & \cdot & \cdot & \cdot & 1_{k,k+1} & \cdot & \cdot & \cdot & \cdot & 0 \\ 0 & \cdot & \cdot & \cdot & \cdot & 1_{K+1,k+2} & \cdot & \cdot & \cdot & 0 \\ 0 & \cdot & \cdot & \cdot & \cdot & \cdot & \cdot & \cdot & \cdot & \cdot \\ 1_{m,1} & \cdot & \cdot & \cdot & \cdot & \cdot & \cdot & 1_{m,m+1} & \cdot & 0 \\ 0 & \cdot & \cdot & \cdot & \cdot & \cdot & \cdot & \cdot & \cdot & \cdot \\ \cdot & \cdot & \cdot & \cdot & \cdot & \cdot & \cdot & \cdot & 0 & 1_{N-1,N} \\ 1_{N,1} & \cdot & \cdot & \cdot & \cdot & \cdot & 0 & 0 & 0 & 0 \end{bmatrix}$$

$$G = \begin{bmatrix} 0 & 0 & 0 & \cdots & \cdots & \cdots & \cdots & \cdots & l_{1,N} \\ l_{2,1} & 0 & 0 & \cdots & \cdots & \cdots & \cdots & \cdots & 0 \\ 0 & l_{3,2} & 0 & \cdots & \cdots & \cdots & \cdots & \cdots & \cdots \\ 0 & 0 & l_{4,3} & 0 & \cdots & \cdots & \cdots & \cdots & \cdots \\ \vdots & \vdots & \vdots & \vdots & \ddots & \vdots & \vdots & \vdots & \vdots \\ 0 & 0 & \cdots & \cdots & l_{k,k-1} & 0 & \cdots & \cdots & l_{k,N} \\ 0 & 0 & \cdots & \cdots & l_{k+1,k} & 0 & \cdots & \cdots & \cdots \\ \vdots & \vdots & \vdots & \vdots & \vdots & \vdots & \ddots & \vdots & \vdots \\ 0 & 0 & \cdots & \cdots & \cdots & \cdots & l_{m,m-1} & 0 & l_{m,N} \\ 0 & 0 & \cdots & \cdots & \cdots & \cdots & \cdots & l_{N,N-1} & 0 \end{bmatrix}$$

Fig. 4

$$F = \begin{bmatrix} 0 & \cdots & \cdots & \cdots & \cdots & \cdots & \cdots & \cdots & \cdots & \cdots & l_{1,N} \\ l_{2,1} & \cdot & \cdot & \cdot & l_{1,h-1} & \cdot & l_{1,j-1} & \cdot & \cdot & \cdot & 0 \\ 0 & l_{3,2} & \cdot & \cdot & \cdot & \cdot & \cdot & \cdot & \cdot & \cdot & 0 \\ 0 & 0 & l_{4,3} & \cdot & \cdot & \cdot & \cdot & \cdot & \cdot & \cdot & 0 \\ \cdot & \cdot & \cdot & \cdot & \cdot & \cdot & \cdot & \cdot & \cdot & \cdot & \cdot \\ 0 & \cdot & \cdot & \cdot & l_{h,h-1} & 0 & \cdot & \cdot & \cdot & \cdot & 0 \\ 0 & \cdot & \cdot & \cdot & 0 & l_{h+1,h} & \cdot & \cdot & \cdot & \cdot & 0 \\ \cdot & \cdot & \cdot & \cdot & \cdot & \cdot & \cdot & \cdot & \cdot & \cdot & \cdot \\ 0 & \cdot & \cdot & \cdot & \cdot & \cdot & l_{j,j-1} & \cdot & \cdot & \cdot & 0 \\ \cdot & \cdot & \cdot & \cdot & \cdot & \cdot & \cdot & \cdot & \cdot & \cdot & \cdot \\ 0 & \cdot & \cdot & \cdot & \cdot & \cdot & \cdot & \cdot & \cdot & l_{N,N-1} & 0 \end{bmatrix}$$

Fig. 5

$$G^{-1} = \begin{bmatrix} 0 & l_{1,2} & . & . & . & . & . & . & . & 0 & . & 0 \\ 0 & 0 & l_{2,3} & . & . & . & . & . & . & 0 & . & 0 \\ 0 & 0 & 0 & l_{3,4} & . & . & . & . & . & . & . & . \\ . & . & . & . & . & . & . & . & . & . & . & . \\ l_{k,1} & . & . & . & . & l_{k,k+1} & . & . & . & . & . & 0 \\ 0 & . & . & . & . & . & l_{K+1,k+2} & . & . & . & . & 0 \\ 0 & . & . & . & . & . & . & . & . & . & . & 0 \\ l_{m,1} & . & . & . & . & . & . & l_{m,m+1} & . & . & . & 0 \\ 0 & . & . & . & . & . & . & . & . & . & . & 0 \\ . & . & . & . & . & . & . & . & . & . & . & . \\ l_{N,1} & . & . & . & . & . & . & . & . & . & . & l_{N-1,N} \\ . & . & . & . & . & . & . & . & . & . & . & 0 \end{bmatrix}$$

Fig. 6

$$F^{-1} = \begin{bmatrix} l_{1,2} & . & . & . & . & . & . & . & . & 0 & 0 \\ 0 & l_{2,3} & . & . & . & . & . & . & . & . & 0 \\ 0 & 0 & l_{3,4} & . & . & . & . & . & . & . & . \\ . & . & . & . & . & . & . & . & . & . & . \\ . & . & . & . & l_{h-1,h} & l_{h,h+1} & . & . & . & . & . \\ . & . & . & . & . & . & . & 0 & . & . & . \\ . & . & . & . & . & . & l_{j-1,j} & . & . & . & . \\ . & . & . & . & . & . & . & . & . & . & l_{N-1,N} \\ l_{N,1} & . & . & . & . & l_{N,h} & . & l_{N,j} & . & . & 0 \end{bmatrix}$$

Fig. 7

$$\begin{bmatrix} 0 & 0 & \ldots & & & & & & & & 0 & 1_{1,42} \\ 1 & 0 & \ldots & & & & & & & & 0 & 1_{2,42} \\ 0 & 1 & 0 & \ldots & & & & & & & 0 & 1_{3,42} \\ 0 & 0 & 1 & 0 & 0 & \ldots & & & & & 0 & 1_{4,42} \\ 0 & 0 & 0 & 1 & 0 & 0 & \ldots & & & & 0 & 0 \\ 0 & 0 & 0 & 0 & 1 & 0 & \ldots & & & & 0 & 1_{6,42} \\ 0 & 0 & 0 & 0 & 0 & 1 & 0 & \ldots & & & 0 & 1_{7,42} \\ 0 & 0 & 0 & 0 & 0 & 0 & 1 & 0 & \ldots & & 0 & 1_{8,42} \\ & & & & & & & & & & 0 & 1_{11,42} \\ & & & & 0 & & & & & & 0 & 1_{17,42} \\ & & & & & & & & & & 0 & 1_{18,42} \\ & & & & & & & & & & 0 & 1_{19,42} \\ & & & & & & & & & & 0 & 1_{20,42} \\ & & & & & & & & & & 0 & 1_{22,42} \\ & & & & & & & & & & 0 & 1_{23,42} \\ & & & & & & & 1_{k,k-1} & & & 0 & 1_{26,42} \\ & & & & & & & & & & 0 & 1_{27,42} \\ & & & & & & & & & & 0 & 1_{28,42} \\ & & & 0 & & & & & & & 0 & 1_{32,42} \\ & & & & & & & & & & 0 & 1_{34,42} \\ & & & & & & & & & & 0 & 1_{36,42} \\ & & & & & & & & & & 1_{42,41} & 0 \end{bmatrix}$$

Fig. 8

PSEUDORANDOM BINARY SEQUENCE BLOCK SHIFTER

FIELD OF THE INVENTION

This invention relates to linear feedback shift registers (LFSR's), and more particularly to methods and apparatus for rapidly determining the state of an LFSR at any point in the past relative to a current state, and to synchronizing the LFSR's in base and mobile stations in a CDMA communication system.

BACKGROUND OF THE INVENTION

LFSR's are used in many applications for generating pseudorandom numbers, which in turn may be used for such purposes as encryption, or synchronization of data transmissions.

A well known such use is in the CDMA (Code Division Multiple Access) scheme employed in the IS-95 standard for cellular telephone transmission. Both the base station and the mobile stations employ a 42-bit LFSR to generate a periodic code with period $2^{42}-1$ bits (known to those in the cellular telephone art as "the Long Code"). For a base station to communicate with a mobile station, their Long Codes must be synchronized. Due to range uncertainty (which affects transmission time) and randomized delays introduced to avoid multiple user traffic collisions, at a given time a mobile station's Long Code and a base station's Long Code may be different, and thus require synchronization in order to communicate. (Typically, the base station's code is ahead of the mobile station's code.)

Synchronization requires a "searcher" in the base station to determine the number of shifts (bit offsets) by which the base station's LFSR leads the mobile station's LFSR. The two LFSRs must then be syunchronized. The base station's LFSR cannot simply be backward-shifted to accomplish this, because the feedback mechanisms are not susceptible of reversal.

One conventional method for accomplishing synchronization in the case where the mobile station's LFSR is ahead of the base station's is to run the base station's LFSR forward at a clock rate many times (typically, 48 times) higher than normal until it has advanced to the desired state.

In the case where the base station's LFSR leads the mobile station's LFSR, the base station's LFSR is simply stopped until the mobile LFSR "catches up" to it. These conventional methods have the disadvantage of requiring extra hardware for the high-speed forward shift, and the disadvantage of wasting time while the LFSR is stopped.

Another conventional method is to store the base station LFSR output over a sufficient number of bits (typically, 1400) to enable matching with the mobile station's current bit pattern. The obvious drawback is that 1400 flip-flops are required, with their resultant increase in cost and power consumption.

Yet another conventional method is to use a mirror-image LFSR in addition to the main LFSR with feedback mechanisms such that it shifts backward through the reverse of the sequence through which the main LFSR shifts forward. This has the obvious drawback of necessitating a great deal of additional circuitry.

While most conventional solutions are hardware-based, some recent algorithms have been posited for determining future states of LFSR's by mathematical methods susceptible of implementation in software or firmware. See the work of Arthur H. M. Ross, Ph.D., at Internet web page http://www.cdj.org/a_ross/LFSR.html (date unknown), or the work of M. Serra at http:/www.csr.uvic.ca/home/mserra/CApaper/node4.html (Jun. 24, 1996). These algorithms, however, are not able to determine past states of LFSRs.

Accordingly, there exists a need for a method of determining a past state of a LFSR that does not require significant additional hardware and that does not cause the waste of significant amounts of time.

It is thus an object of the present invention to provide a method of resetting a LFSR that eliminates the drawbacks of conventional CDMA systems.

It is a further object of the present invention to provide a method for resetting a LFSR that has fixed overhead for shifting backward or forward independent of shift length.

It is a further object of the present invention to provide a practical method of performing very large shifts, which are impractical in conventional systems.

It is a further object of the present invention to provide a method of resetting a LFSR that may be easily embedded in firmware in an application-specific integrated circuit (ASIC) and ideally in parallel operation where multiple shift positions are needed, as in multi-user detection.

These and other objects of the invention will become apparent to those skilled in the art from the following description thereof.

SUMMARY OF THE INVENTION

In accordance with the teachings of the present invention, these and other objects may be accomplished by the present systems and methods of generating spreading codes which are resistant to the effects of time delays in CDMA systems. An embodiment of the present invention includes a method of determining an inverse transition matrix which when used to multiply in modulo-2 arithmetic the current state of an LFSR yields the previous state of the LFSR, and multiplying the state of the LFSR by the inverse transition matrix in modulo-2 arithmetic once for each desired backward shift of the LFSR, and loading the state thus determined back into the LFSR. Another embodiment of the invention uses apparatus to determine the inverse transition matrix, to multiply the LFSR contents by the inverse transition matrix one for each backward shift required, and to load the result back into the LFSR.

The invention will next be described in connection with certain exemplary embodiments; however, it should be clear to those skilled in the art that various modifications, additions and subtractions can be made without departing from the spirit or scope of the claims.

BRIEF DESCRIPTION OF THE DRAWINGS

The invention will be more clearly understood by reference to the following detailed description of an exemplary embodiment in conjunction with the accompanying drawings, in which:

FIG. 4 illustrates the transition matrix for the LFSR of FIG. 2.

FIG. 5 illustrates the transition matrix for the LFSR of FIG. 3.

FIG. 6 illustrates the inverse transition matrix for the LFSR of FIG. 2.

FIG. 7 illustrates the inverse transition matrix for the LFSR of FIG. 3.

FIG. 8 illustrates the transition matrix for a 42-bit CDMA LFSR.

DESCRIPTION OF THE INVENTION

A preferred embodiment of the present invention is associated with the 42-bit LFSR employed for producing the Long Code used for synchronizing data transmission between a base station and a mobile station in an IS-95 CDMA cellular communications system.

To service a mobile user, the base station's LFSR must be set to the same value as the mobile user's. A searcher algorithm in the base station determines the amount of time difference between the two LFSR's. Time alignment of the base station Long Code generator LFSR includes resetting the binary value stored in the shift register to a value of a previous or future time, according to the searcher results.

Figure 1:
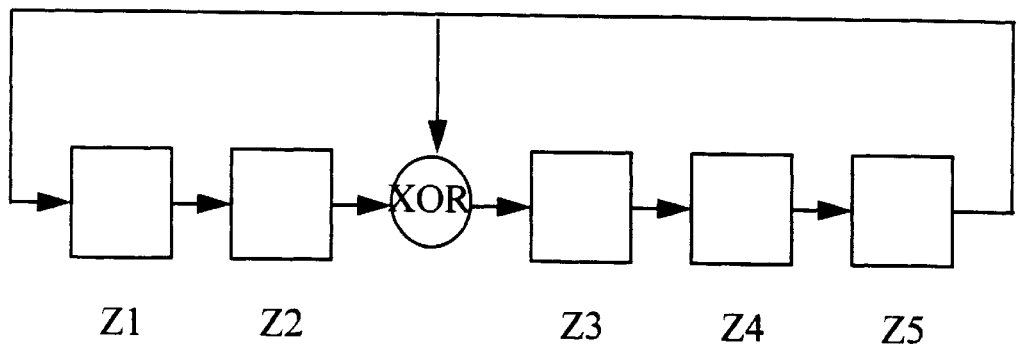
FIG. 1 depicts a generic 5-bit LFSR.

An example of an embodiment of the present invention will now be considered using a five-bit LFSR, an example of which is shown in FIG. 1. Those in the art will recognize this as a Type I, or Galois, LFSR since the exclusive OR is located in a series path (as opposed to a Type II, or Fibonacci, LFSR which would have the exclusive OR in the feedback paths). Although the ensuing discussion applies to the Type I LFSR, the principles apply equally to the Type II LFSR.

The state transition equations for the LFSR of FIG. 1 are $z_1' = z_5$
$z_2' = z_1$
$z_3' = (z_2 \text{ XOR } z_5)$
$z_4' = z_3$
$z_5' = z_4$ where $z_i$ is the present state of cell i and $z_i'$ is the state after clocking the shift register one time. In matrix form, this can be expressed as:

$$[z_1', z_2', z_3', z_4', z_5']^T = A \times [z_1, z_2, z_3, z_4, z_5]^T$$

where all operations are carried out in modulo 2 arithmetic, T indicates transpose and A is the transition matrix:

$$A = \begin{bmatrix} 0 & 0 & 0 & 0 & 1 \\ 1 & 0 & 0 & 0 & 0 \\ 0 & 1 & 0 & 0 & 1 \\ 0 & 0 & 1 & 0 & 0 \\ 0 & 0 & 0 & 1 & 0 \end{bmatrix}$$

Because of the modulo-2 arithmetic that must be employed, the inverse transition matrix can not be determined from the transition matrix by the conventional means used in decimal arithmetic for determining an inverse matrix. This becomes evident by taking a conventional inverse transition matrix, multiplying it by the transition matrix, and finding that the result is not the identity matrix.

The inverse transition matrix can be determined empirically by determining what is necessary to transit the LFSR back by one shift. For the LFSR of FIG. 1, the inverse transition matrix is:

$$A^{-1} = \begin{bmatrix} 0 & 1 & 0 & 0 & 0 \\ 1 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

Obtaining the next state of the LFSR using the transition matrix could be written as:

$$\begin{bmatrix} 0 & 0 & 0 & 0 & 1 \\ 1 & 0 & 0 & 0 & 0 \\ 0 & 1 & 0 & 0 & 1 \\ 0 & 0 & 1 & 0 & 0 \\ 0 & 0 & 0 & 1 & 0 \end{bmatrix} \times \begin{bmatrix} z_1 \\ z_2 \\ z_3 \\ z_4 \\ z_5 \end{bmatrix} = \begin{bmatrix} z_1' \\ z_2' \\ z_3' \\ z_4' \\ z_5' \end{bmatrix}$$

Similarly, obtaining the previous state (one clock pulse ago) can now be written as:

$$\begin{bmatrix} 0 & 1 & 0 & 0 & 0 \\ 1 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} \times \begin{bmatrix} z_1 \\ z_2 \\ z_3 \\ z_4 \\ z_5 \end{bmatrix} = \begin{bmatrix} z_{-1} \\ z_{-2} \\ z_{-3} \\ z_{-4} \\ z_{-5} \end{bmatrix}$$

Block jumps (jumps of more than one clock pulse) may easily be obtained by raising the transition matrix to a power equal to the desired number of clock pulses prior to performing the multiplication. That is:

$$\begin{bmatrix} 0 & 0 & 0 & 0 & 1 \\ 1 & 0 & 0 & 0 & 0 \\ 0 & 1 & 0 & 0 & 1 \\ 0 & 0 & 1 & 0 & 0 \\ 0 & 0 & 0 & 1 & 0 \end{bmatrix}^N \times \begin{bmatrix} z_1 \\ z_2 \\ z_3 \\ z_4 \\ z_5 \end{bmatrix}$$

yields the state of the LFSR N clock pulses in the future, while $$\begin{bmatrix} 0 & 1 & 0 & 0 & 0 \\ 1 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}^N \times \begin{bmatrix} z_1 \\ z_2 \\ z_3 \\ z_4 \\ z_5 \end{bmatrix}$$

yields the state of the LFSR N clock pulses in the past.

It will now be shown how to find the inverse transition matrix for a Type I or Type II LFSR of arbitrary length >2.

Figure 2:
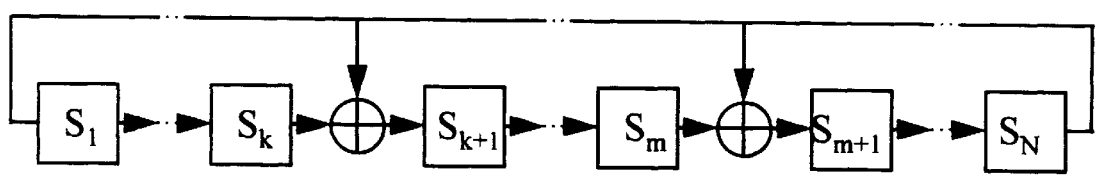
FIG. 2 depicts a Type I LFSR of arbitrary length.
Figure 3:
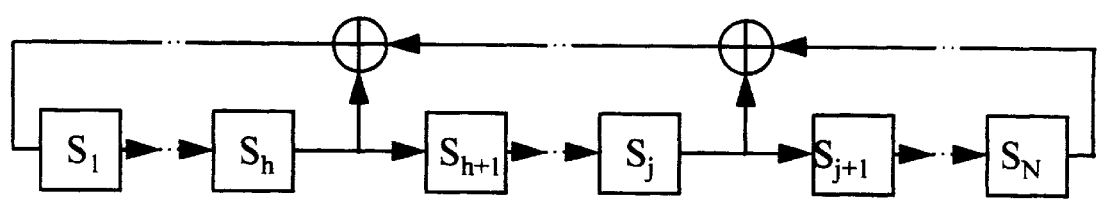
FIG. 3 depicts a Type II LFSR of arbitrary length.

A Type I (Galois) LFSR of arbitrary length is shown in FIG. 2. A Type II (Fibonacci) LFSR of arbitrary length is shown in FIG. 3. Generally, the number of taps and tap positions are not the same for Galois and Fibonacci versions. The original state of each of the LFSR is the binary sequence $\{S_k\}_k$ for k=1, ..., N. The set of state transition equation for Type 1 (Galois) LFSR is in general, as follows:

$S_1^+ = S_N$
$S_2^+ = S_1$ $$S_k^+ = S_{k-1}$$

$$S_{k+1}^+ = S_k + S_N$$

$$\vdots$$

$$S_{m+1}^+ = S_m + S_N$$

$$S_{m+2}^+ = S_{m+1}$$

$$\vdots$$

$$S_N^+ = S_{N-1}$$

where k, . . . , m are positive integers less than N, corresponding to tap positions in the Type 1 Galois LFSR. Note that "+" is the Exclusive—OR or modulo two operation The transition matrix representing these state transition equations is given in FIG. 4.

The set of state transition equations for Type 2 (Fibonacci) LFSR is in general, as follows:

$$S_1^+ = S_k + \ldots + S_j + S_n$$

$$S_2^+ = S_1$$

$$S_3^+ = S_2$$

$$\vdots$$

$$S_N^+ = S_{N-1}$$

where h, . . . , j are positive integers less than N.

The state transition matrix, G, for one step forward in the Galois LFSR is shown in FIG. 4. The N×N (where N is the number of positions in the LFSR) matrix has a subdiagonal of ones, and ones in the Nth column corresponding to tap positions. All other elements are zero.

The state transition matrix, F, for one step forward in the Fibonacci LFSR is shown in FIG. 5. The N×N matrix has a subdiagonal of ones, and ones in the first row corresponding to tap positions. All other elements are zero.

Determination of inverse transition matrix for generalized Type I:

The problem of determining $G^{-1}$, the inverse of the Galois transition matrix is equivalent to finding the permutations needed to reverse the corresponding state equations.

The matrix G maps the sequence $\{S_k\}_k$ into the next step $\{S_k^+\}_k$.

Substituting the $S_k^+$ with the equivalent $S_k$ terms, the one-step inverse transition matrix operations can be shown as follows:

$$G^{-1} * \begin{bmatrix} S_N \\ S_1 \\ S_2 \\ \cdot \\ \cdot \\ S_{k-1} \\ S_k + S_N \\ S_{k+1} \\ \cdot \\ \cdot \\ S_m + S_N \\ S_{m+1} \\ \cdot \\ \cdot \\ \cdot \\ S_{N-1} \end{bmatrix} = \begin{bmatrix} S_1 \\ S_2 \\ S_3 \\ \cdot \\ \cdot \\ S_k \\ S_{k+1} \\ S_{k+2} \\ \cdot \\ \cdot \\ S_{m+1} \\ S_{m+2} \\ \cdot \\ \cdot \\ \cdot \\ S_N \end{bmatrix}$$

The first row of $G^{-1}$ is all zeros except for a one in column 2 to map $S_1$ to the first position in the present state vector, on the right hand side. The second row of $G^{-1}$ is all zeros except for a one in column 3 to map $S_2$ to the second position in the present state vector, on the right-hand side:
Row 1 of $G^{-1}=[0\ 1_{1,2}\ 0\ 0\ \ldots\ 0]$
Row 2 of $G^{-1}=[0\ 0\ 1_{2,3}\ 0\ \ldots\ 0]$
Row m of $G^{-1}=[0\ \ldots\ 1_{m,m+}\ \ldots\ ]$, for $1 \leq m \leq N$
Row k of $G^{-1}=[1_{k,1}\ 0\ \ldots\ 1_{k,k+1}\ \ldots\ 0]$, since $S_1^+=S_N$ and $S_N+(S_K+S_N)=S_K$
Row k+1 of $G^{-1}=[0\ \ldots\ 1_{k+1,k+2}\ \ldots\ 0]$
This is true for all k, for 1<k<N, where each k corresponds to a tap in the LFSR.

The resulting structure of the inverse transition matrix $G^{-1}$ for a Type I (Galois) LFSR is given in FIG. 6. Then, $G^{-1}*G=N\times N$ which is the identity matrix of rank N. The product is obtained using modulo 2 arithmetic.

Determination of inverse transition matrix for generalized Type II:

The problem of determining $F^{-1}$, the inverse of the Fibonacci transition matrix is equivalent to finding the permutations needed to reverse the corresponding state equations.

The matrix F maps the sequence $\{S_k\}_k$ into the next step $\{S_k^+\}_k$.

Substituting the $S_k^+$ with the equivalent $S_k$ terms, the one-step inverse transition matrix operations can be shown as follows:

$$F^{-1} * \begin{bmatrix} S_h + \ldots + S_j + S_N \\ S_1 \\ S_2 \\ S_3 \\ S_4 \\ \vdots \\ S_{N-1} \end{bmatrix} = \begin{bmatrix} S_1 \\ S_2 \\ S_3 \\ S_4 \\ S_5 \\ \vdots \\ S_N \end{bmatrix}$$

The first row of $F^{-1}$ is all zeros except for a one in column 2 to map $S_1$ to the first position in the present state vector, on the right hand side. The second row of $F^{-1}$ is all zeros except for a one in column 3 to map $S_2$ to the second position in the present state vector, on the right-hand side.
Row 1 of $F^{-1}=[0\ 1_{1,2}\ 0\ 0\ \ldots\ 0]$
Row 2 of $F^{-1}=[0\ 0\ 1_{2,3}\ 0\ \ldots\ 0]$
In general the pattern is
Row w of $F^{-1}=[0\ \ldots\ 1_{w,w+1}\ \ldots\ ]$, for $1 \leq w \leq N$, and
Row N of $F^{-1}=[1_{N,1}\ 0\ \ldots\ 1_{N,h}\ \ldots\ 1_{N,j}\ \ldots\ 0]$
Row k+1 of $G^{-1}=[0\ \ldots\ 1_{k+1,k+2}\ \ldots\ 0]$ for 1<h<j<N The resulting structure of the inverse transition matrix $F^{-1}$ for a Type II (Fibonacci) LFSR is given in FIG. 7. Then, $F^{-1}*F=I_{N\times N}$ which is the identity matrix of rank N. The product is obtained using modulo 2 arithmetic.

Figure 9:
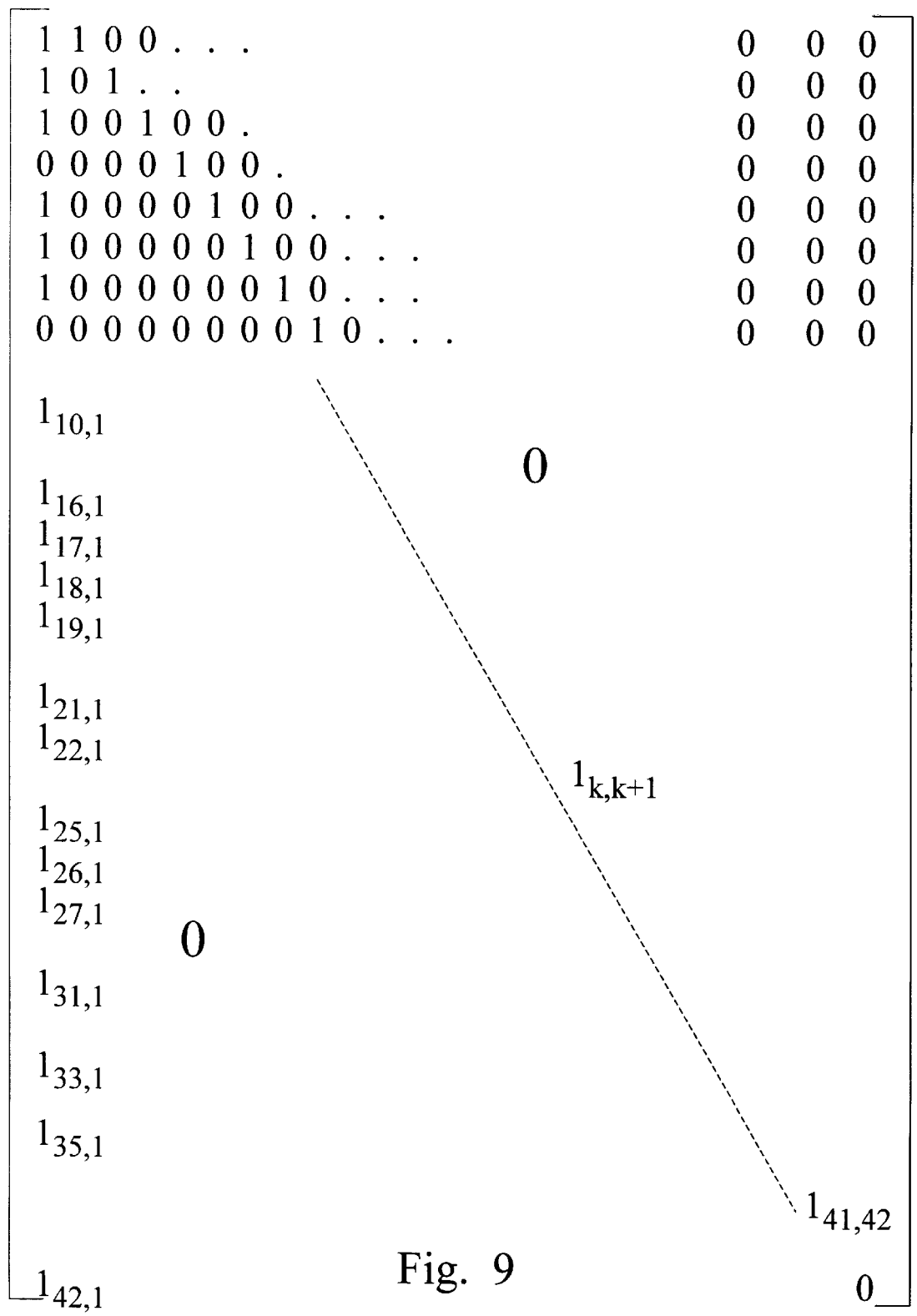
FIG. 9 illustrates the inverse transition matrix for a 42-bit CDMA LFSR.

Application to the IS-95 CDMA Long Code LFSR:

The forward transition matrix A for the IS-95 Long Code is given in FIG. 8. $A^{-1}$, the inverse of A for shifting backwards in time is shown in FIG. 9. By direct multiplication using modulo 2 arithmetic, $A*A^{-1}=I_{42\times 42}$, the identity matrix of rank 42.

Considering the one-step forward case, the shifting and XOR operation can be emulated as a matrix operation:

$$S_1 = A \times S_0$$

where
$S_1$=42-bit contents of LFSR after one clock period,
$S_0$=initial contents of LFSR
A is the transition matrix of FIG. 8.

Similarly, the one-step backward case can be emulated by:

$$S_{-1} = A^{-1} \times S_0.$$

The 42-bit contents of the LFSR can be shifted up to $2^{42}-1$ clock pulses in a single matrix operation. For example, had the value of $$A^7 = A*A*A*A*A*A*A$$

been precalculated and prestored, emulation of shifting 7 clock pulses into the future could be performed as:

$$S_7 = A^7 \times S_0$$

It may be beneficial to precalculate and prestore such matrices, such as power-of-two numbers of shifts:

$$A^2, A^4, A^8, A^{16}, \ldots A^{-2}, A^{-4}, A^{-8}, A^{-16}$$

A shift emulation of some arbitrary number of clock pulses can then be performed by a few well-chosen matrix operations in succession. While an example involving powers of two has been considered, it will be apparent to those skilled in the art that any power can be used and that matrices of arbitrary powers can be stored.

In a similar vein, with some hardware implementations of an LFSR, for shifts of fewer than 42 clock pulses it may be faster to actually shift the LFSR than to perform the matrix multiplies. In such cases, shifts by large numbers of clock pulses may be speeded up by calculating and prestoring values for multiples of 42 shifts:

$$A^{42}, A^{84}, A^{126}, A^{168}, \ldots A^{-42}, A^{-84}, A^{-126}, A^{-168}$$

Shifting can then be emulated by matrix mathematics unless or until there are fewer than 42 forward shifts remaining to be performed, and they can then be performed by actual shifting. The number 42 has been chosen here since that is the number of bits in the LFSR under the IS-95 standard, but other numbers may be chosen and still fall within the scope of the invention.

The invention may be practiced in host hardware equipped with computational capability, such as a minicomputer or microcomputer, in which a program may be employed to determine the inverse transition matrix and to perform matrix multiplications with it so as to obtain past states of an LFSR. Firmware may also be employed, enabling practicing the invention in, for example, an ASIC (application-specific integrated circuit).

Figure 10:
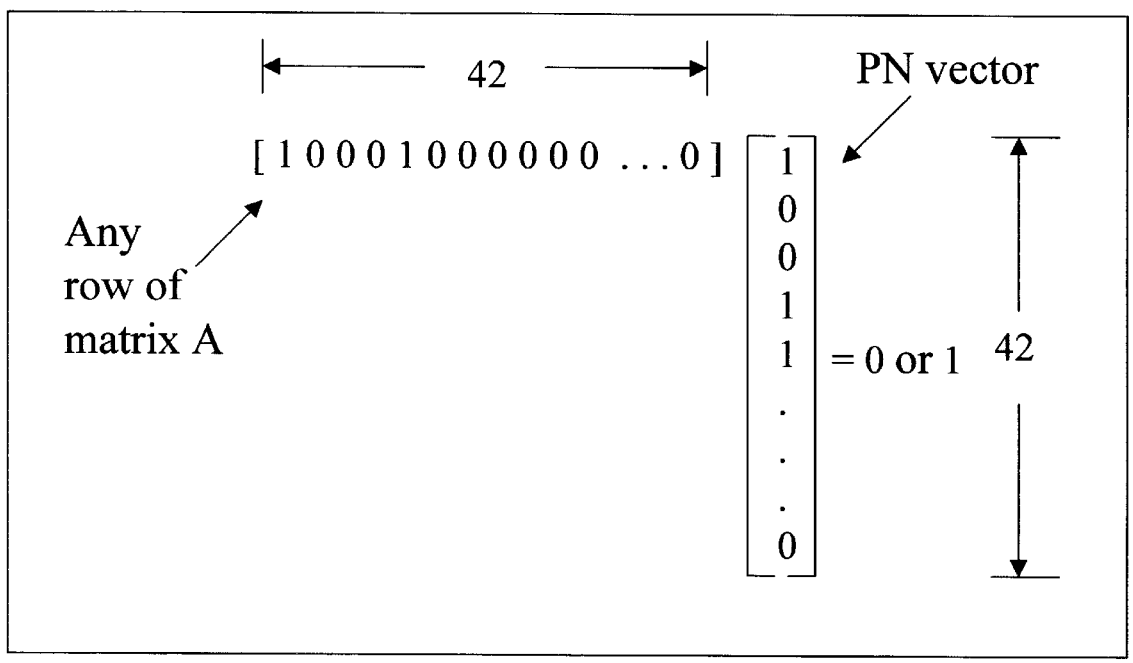
FIG. 10 depicts a basic operation of modulo-2 matrix multiplication.

Modulo-2 matrix multiplication can be speeded up using parity checker hardware instead of actually performing a row-by-column multiplication. FIG. 10 depicts the multiplication of the PN vector by a row of a transition matrix. This process must be executed for each row of the transition matrix. In modulo-2 arithmetic, the process is equivalent to:

overlaying the row and PN vector;
ANDing the corresponding bits; and
summing the resultant 1's in modulo-2 addition.

In modulo-2 arithmetic, the latter step can yield a result of either zero or one, and zero if the number of 1's is even, and one if the number of 1's is odd. This determination of whether the number of 1's is even or odd is the function performed by a parity checker. If host hardware includes a parity checker it can be invoked to assist in the matrix multiply, saving 42 row-by-column multiplications each time.

It will thus be seen that the invention efficiently attains the objects set forth above, among those made apparent from the preceding description. In particular, the invention provides rapid determination of a past state of a linear feedback shift register without significant additional hardware.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A method of restoring a linear feedback shift register to a state that it had N clock pulses prior to a present state, N being an integer greater than or equal to 1, comprising:

determining a first inverse transition matrix for the linear feedback shift register such that modulo-2 multiplication of a current binary vector contained in the linear feedback shift register by the first inverse transition matrix produces a binary vector that was contained in the linear feedback shift register prior to the clock pulse which advanced the linear feedback shift register to its current binary vector;

determining a second inverse transition matrix which is the first inverse transition matrix raised to a power J where J is an integer, and if J is equal to N, multiplying in modulo-2 arithmetic the second inverse transition matrix by the current binary vector to produce the binary vector that was contained in the linear feedback shift register N clock pulses prior to the present state; and loading the binary vector into the linear feedback shift register.

2. The method of claim 1 wherein if J is not equal to N:
multiplying in modulo-2 arithmetic the second inverse transition matrix by the current binary vector to produce the binary vector that was contained in the linear feedback shift register J clock pulses prior to the present state;

reducing the value of N by the value of J;

repeating the multiplying and reducing steps if the reduced N is greater than 0;

loading the binary vector into the linear feedback shift register; and shifting the linear feedback shift register forward ABS(N) times if the reduced N is less than 0, where ABS(N) is the absolute value of the reduced N.

3. The method of claim 2 wherein the linear feedback shift register has M stages where N is greater than or equal to M, and J is an integer multiple of M.

4. The method of claim 2 wherein:

said second inverse transition matrix has been predetermined and stored.

5. The method of claim 2 wherein:

said second inverse transition matrix is selected from a plurality of third inverse transition matrices which have been predetermined and stored, each being the first inverse transition matrix raised to a different integer power.

6. The method of claim 1 wherein the linear feedback shift register has M stages and J is equal to I*M where I is an integer and N is greater than $2^M-1$, and the method further comprises converting N to its modulo($2^M$) value prior to the multiplying step.

7. The method of claim 1 wherein the linear feedback shift register leads a second linear feedback shift register by N clock pulses, whereby restoring the linear feedback shift register to the state that it had N clock pulses prior to the present state synchronizes the linear feedback shift register with the second linear feedback shift register.

8. The method of claim 7 to be practiced in a CDMA system wherein the linear feedback shift register is in a base station and the second linear feedback shift register is in a mobile station.

9. The method of claim 7 to be practiced in a CDMA system wherein the linear feedback shift register is in a mobile station and the second linear feedback shift register is in a base station.

10. Apparatus for restoring a linear feedback shift register to a state that it had N clock pulses prior to a present state, N being an integer greater than or equal to 1, comprising:

means for determining a first inverse transition matrix for the linear feedback shift register such that modulo-2 multiplication of a current binary vector contained in the linear feedback shift register by the first inverse transition matrix produces a binary vector that was contained in the linear feedback shift register prior to the clock pulse which advanced the linear feedback shift register to its current binary vector;

means for determining a second inverse transition matrix which is the first inverse transition matrix raised to a power J where J is an integer;

means for determining whether J is equal to N;

means for multiplying, if J is equal to N, in modulo-2 arithmetic the second inverse transition matrix by the current binary vector to produce the binary vector that was contained in the linear feedback shift register N clock pulses prior to the present state; and means for loading, if J is equal to N, the binary vector into the linear feedback shift register.

11. The apparatus of claim 10, further comprising:

means for multiplying, if J is not equal to N, in modulo-2 arithmetic the second inverse transition matrix by the current binary vector to produce the binary vector that was contained in the linear feedback shift register J clock pulses prior to the present state; and means for reducing the value of N by the value of J;

means for repeating the multiplying and reducing operations if the reduced N is greater than 0;

means for loading the binary vector into the linear feedback shift register if the reduced N is equal to or less than 0; and means for shifting the linear feedback shift register forward ABS(N) times if the reduced N is less than 0, where ABS(N) is the absolute value of the reduced N.

12. The apparatus of claim 11 further comprising:

means for predetermining and storing the second inverse transition matrix.

13. The apparatus of claim 12 further comprising:

means for predetermining and storing a plurality of third inverse transition matrices, each being the first inverse transition matrix raised to a different integer power; and means for selecting the second inverse transition matrix from among the plurality of third inverse transition matrices.

14. The apparatus of claim 10 wherein the linear feedback shift register has M stages and J is equal to I*M where I is an integer and N is greater than $2^M-1$, and further comprising means for converting N to its modulo ($2^M$) value prior to the multiplying operation.

15. The apparatus of claim 10 wherein the linear feedback shift register has M stages where N is greater than or equal to M, and J is an integer multiple of M.

16. The apparatus of claim 10 wherein the linear feedback shift register leads a second linear feedback shift register by N clock pulses, whereby restoring the linear feedback shift register to the state that it had N clock pulses prior to the present state synchronizes the linear feedback shift register with the second linear feedback shift register.

17. The apparatus of claim 16 in a CDMA system wherein the linear feedback shift register is in a base station and the second linear feedback shift register is in a mobile station.

18. The apparatus of claim 16 in a CDMA system wherein the linear feedback shift register is in a mobile station and the second linear feedback shift register is in a base station.

19. Apparatus for restoring a linear feedback shift register to a state that it had N clock pulses prior to a present state, N being an integer greater than or equal to 1, comprising:

a logic device for determining a first inverse transition matrix for the linear feedback shift register such that modulo-2 multiplication of a current binary vector contained in the linear feedback shift register by the first inverse transition matrix produces a binary vector that was contained in the linear feedback shift register prior to the clock pulse which advanced the linear feedback shift register to its current binary vector;

the logic device being further adapted to determine a second inverse transition matrix which is the first inverse transition matrix raised to a power J where J is an integer;

the logic device being further adapted to determine whether J is equal to N;

the logic device being further adapted to multiply, if J is equal to N, in modulo-2 arithmetic the second inverse transition matrix by the current binary vector to produce the binary vector that was contained in the linear feedback shift register N clock pulses prior to the present state; and a loading circuit for loading, if J is equal to N, the binary vector into the linear feedback shift register.

20. The apparatus of claim 19 wherein:

the logic device is further adapted to multiply, if J is not equal to N, in modulo-2 arithmetic the second inverse transition matrix by the current binary vector to produce the binary vector that was contained in the linear feedback shift register J clock pulses prior to the present state;

the logic device is further adapted to reduce the value of N by the value of J after each multiplication;

the logic device is further adapted to repeat the multiplying and reducing operations if the reduced N is greater than 0; and the apparatus further includes a loading circuit to load the binary vector into the linear feedback shift register if the reduced N is equal to or less than 0;

the apparatus further includes a shifter for shifting the linear feedback shift register forward ABS(N) times after loading it if the reduced N is less than 0, where ABS(N) is the absolute value of the reduced N.

21. The apparatus of claim 20 wherein:

the logic device is further adapted to predetermine and store the second inverse transition matrix.

22. The apparatus of claim 20 wherein:

the logic device is further adapted to predetermine and store a plurality of third inverse transition matrices, each being the first inverse transition matrix raised to a different integer power; and the logic device is further adapted to select the second inverse transition matrix from among the stored third inverse transition matrices.

23. The apparatus of claim 19 wherein the linear feedback shift register has M stages and J is equal to I*M where I is an integer and N is greater than $2^M-1$, and the logic device is further adapted to convert N to its modulo($2^M$) value prior to the multiplying operation.

24. The apparatus of claim 19 wherein the linear feedback shift register has M stages where N is greater than or equal to M, and J is an integer multiple of M.

25. The apparatus of claim 19 wherein the linear feedback shift register leads a second linear feedback shift register by N clock pulses, whereby restoring the linear feedback shift register to the state that it had N clock pulses prior to the present state synchronizes the linear feedback shift register with the second linear feedback shift register.

26. The apparatus of claim 25 in a CDMA system wherein the linear feedback shift register is in a base station and the second linear feedback shift register is in a mobile station.

27. The apparatus of claim 25 in a CDMA system wherein the linear feedback shift register is in a mobile station and the second linear feedback shift register is in a base station.

28. The apparatus of claim 19 further comprising memory means for storing instructions, and wherein the logic device is responsive to at least one instruction stored by said memory means.

* * * * *